United States Patent
Grebet et al.

(10) Patent No.: US 10,403,661 B2
(45) Date of Patent: Sep. 3, 2019

(54) IMAGE SENSING DEVICE WITH CAP AND RELATED METHODS

(71) Applicant: STMICROELECTRONICS PTE LTD, Singapore (SG)

(72) Inventors: Jean-Michel Grebet, Singapore (SG); Wee Chin Judy Lim, Singapore (SG)

(73) Assignee: STMICROELECTRONICS PTE LTD, Singapore (SG)

(*) Notice: Subject to any disclaimer, the term of this patent is extended or adjusted under 35 U.S.C. 154(b) by 15 days.

(21) Appl. No.: 15/619,649

(22) Filed: Jun. 12, 2017

(65) Prior Publication Data
US 2017/0278885 A1    Sep. 28, 2017

Related U.S. Application Data

(62) Division of application No. 14/578,718, filed on Dec. 22, 2014, now Pat. No. 9,691,801.

(51) Int. Cl.
*H01L 27/146* (2006.01)
*H01L 31/0203* (2014.01)

(52) U.S. Cl.
CPC .. *H01L 27/14618* (2013.01); *H01L 27/14636* (2013.01); *H01L 27/14683* (2013.01); *H01L 31/0203* (2013.01); *H01L 2224/48091* (2013.01); *H01L 2224/48227* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 5,914,488 A | 6/1999 | Sone | |
| 7,359,579 B1* | 4/2008 | Paek | H01L 27/14618 257/E31.117 |
| 2005/0095835 A1 | 5/2005 | Humpston et al. | |
| 2010/0065742 A1 | 3/2010 | Kobayashi et al. | |
| 2012/0104536 A1* | 5/2012 | Seo | H01L 27/14618 257/459 |
| 2013/0181310 A1 | 7/2013 | Jun | |
| 2016/0181299 A1 | 6/2016 | Grebet et al. | |

FOREIGN PATENT DOCUMENTS

CN    205376527 U    7/2016

* cited by examiner

*Primary Examiner* — Reema Patel
*Assistant Examiner* — Steven M Christopher
(74) *Attorney, Agent, or Firm* — Slater Matsil, LLP

(57) ABSTRACT

An image sensing device includes an interconnect layer and a number of grid array contacts arranged on a bottom side of the interconnect layer. An image sensor integrated circuit (IC) is carried by the interconnect layer and has an image sensing surface. A number of electrical connections are coupled between the image sensor IC and an upper side of the interconnect layer. A transparent plate overlies the image sensing surface of the image sensor IC. A cap is carried by the interconnect layer and has an opening overlying transparent plate and the image sensing surface. The cap has an upper wall spaced above the interconnect layer and the image sensor IC to define an internal cavity and the cap defines an air vent coupled to the internal cavity.

27 Claims, 4 Drawing Sheets

IMAGE SENSING DEVICE WITH CAP AND RELATED METHODS

CROSS-REFERENCE TO RELATED APPLICATIONS

This application a divisional of U.S. application Ser. No. 14/578,718, filed on Dec. 22, 2014, which application is hereby incorporated herein by reference.

TECHNICAL FIELD

The present disclosure relates to the field of electronic devices, and, more particularly, to semiconductor devices and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via solder bumps.

Referring initially to FIG. 1, a typical image sensing device 100 is now described. The image sensing device 100 includes an interconnect layer 105, a plurality of ball grid array (BGA) contacts 106a-106h carried by the interconnect layer, an image sensor IC 103 over the interconnect layer, and an adhesive layer 107 between the interconnect layer and the image sensor IC. The image sensing device 100 includes bond wires 104a-104b coupled between the image sensor IC 103 and the interconnect layer 105, a transparent plate 102 aligned with the image sensor IC image sensing surface, and encapsulation material 101 completely surrounding the image sensor IC and the transparent plate.

Referring now to FIG. 2, another typical image sensing device 200 is now described. The image sensing device 200 includes an interconnect layer 205, a plurality of BGA contacts 206a-206h carried thereby, and an image sensor IC 203 over the interconnect layer. The image sensing device 200 includes bond wires 204a-204b coupled between the image sensor IC 203 and the interconnect layer 205, a transparent plate 202 aligned with the image sensor IC image sensing surface, an annular adhesive layer 208 between the image sensor IC and the transparent plate, and encapsulation material in two stacked layers 201a, 201b surrounding the image sensor IC and the transparent plate.

SUMMARY

Generally speaking, an image sensing device may include an interconnect layer and a plurality of grid array contacts carried thereby, and an image sensor IC carried by the interconnect layer and coupled to the plurality of grid array contacts. The image sensor IC may have an image sensing surface. The image sensing device may include a transparent plate carried by the image sensor IC and aligned with the image sensing surface, and a cap carried by the interconnect layer and having an opening aligned with the image sensing surface. The cap may have an upper wall spaced above the interconnect layer and the image sensor IC to define an internal cavity, and the cap may define an air vent coupled to the internal cavity.

In some embodiments, the cap has an inner peripheral edge spaced from adjacent portions of the transparent plate to define the air vent. The inner peripheral edge may extend laterally over the adjacent portions of the transparent plate.

In other embodiments, the air vent extends through the upper wall of the cap. The transparent plate may be received within the opening of the cap. The image sensing device may also include adhesive material between the cap and the transparent plate.

Moreover, the image sensing device may further comprise a plurality of bond wires extending between the image sensor IC and the interconnect layer. The image sensing device may also include encapsulation material covering a portion of the plurality of bond wires. The image sensing device may further comprise a first adhesive layer between the cap and the interconnect layer, and a second adhesive layer between the transparent plate and the image sensor IC.

Another aspect is directed to a method for making an image sensing device. The method may include coupling an image sensor IC to an interconnect layer and to a plurality of grid array contacts carried by the interconnect layer, the image sensor IC having an image sensing surface, and coupling a transparent plate to the image sensor IC and aligned with the image sensing surface. The method may include coupling a cap to the interconnect layer and having an opening aligned with the image sensing surface, the cap having an upper wall spaced above the interconnect layer and the image sensor IC to define an internal cavity, and the cap defining an air vent coupled to the internal cavity.

DETAILED DESCRIPTION OF ILLUSTRATIVE EMBODIMENTS

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
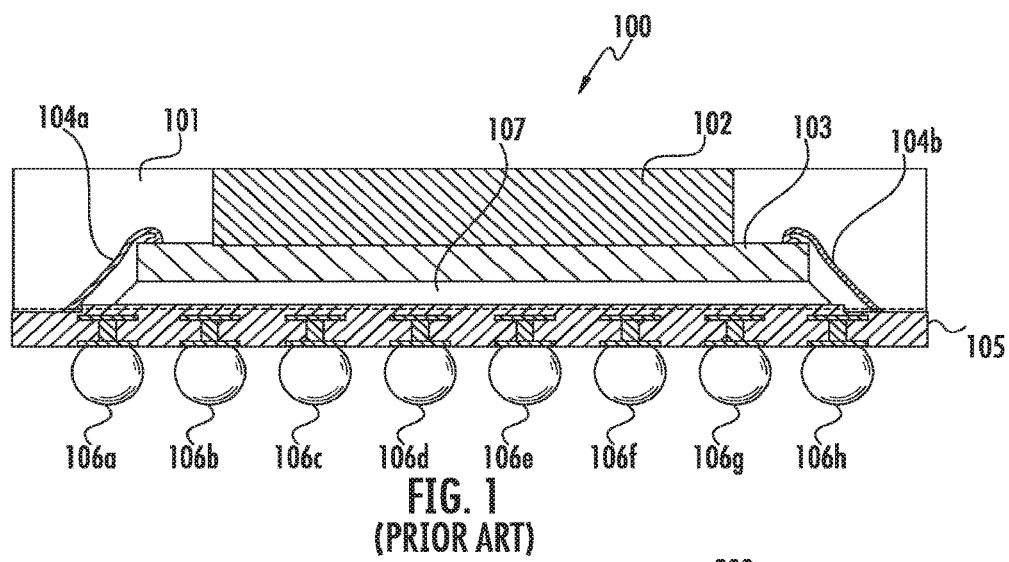
FIGS. 1 and 2 are schematic cross-sectional views of image sensing devices, according to the prior art.
Figure 2:
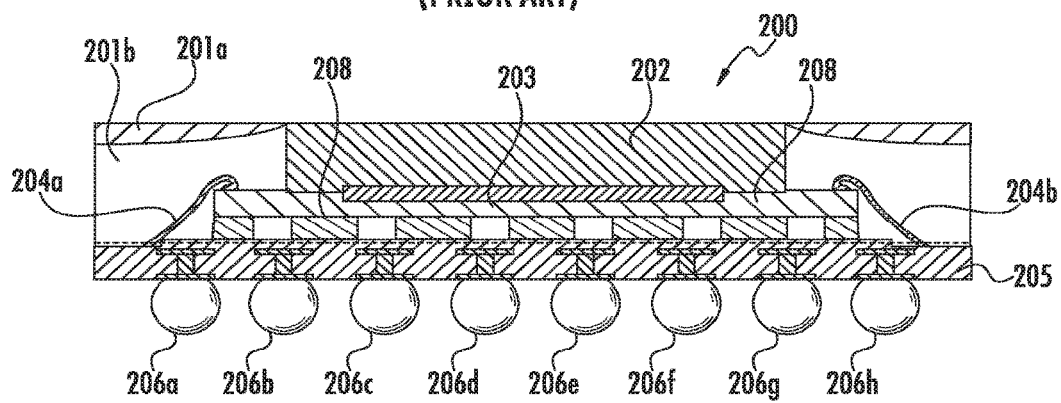
Figure 3:
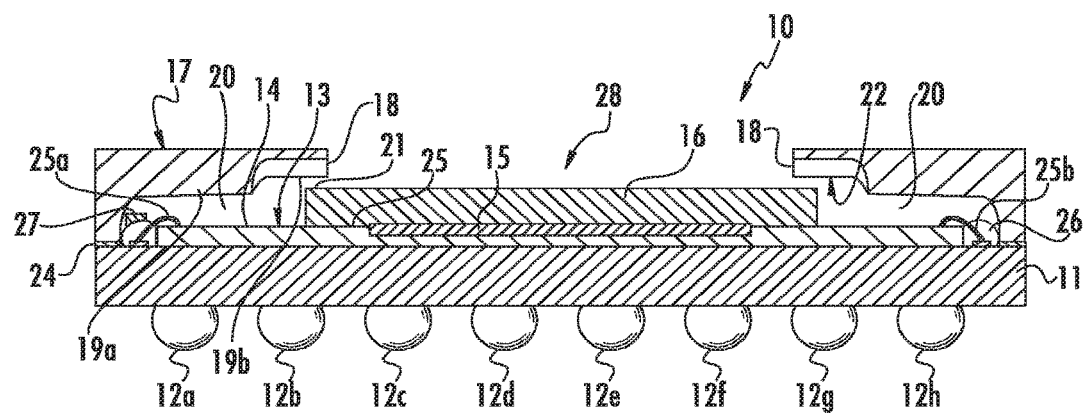
FIG. 3 is a schematic cross-sectional view of an image sensing device, according to the present disclosure.
Figure 4:
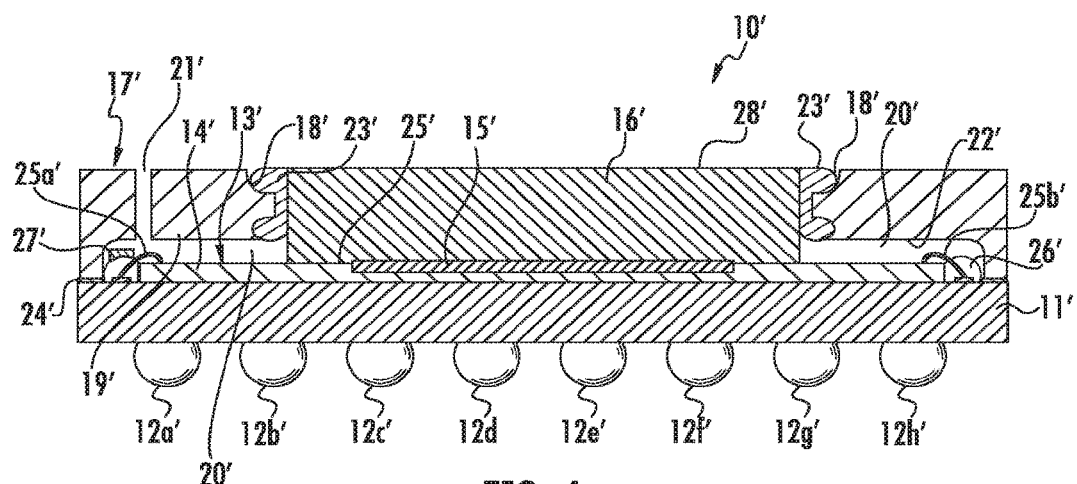
FIG. 4 is a schematic cross-sectional view of another embodiment of the image sensing device, according to the present disclosure.

Referring now to FIG. 3, an image sensing device 10 according to the present disclosure is now described. The image sensing device 10 illustratively includes an interconnect layer 11 with upper and lower surfaces, and a plurality of grid array contacts 12a-12h carried by the lower surface of the interconnect layer. The image sensing device 10 illustratively includes an image sensor IC 13 carried by the upper surface of the interconnect layer and coupled to the plurality of grid array contacts (e.g., using vias). For example, the grid array contacts 12a-12h may comprise the illustrated BGA contacts or land grid array (LGA) contacts. The image sensor IC 13 illustratively includes a substrate 14 (e.g., silicon), and an image sensing surface 15 on an upper surface of the substrate.

The image sensing device 10 illustratively includes a transparent plate 16 carried by the image sensor IC 13 and aligned with the image sensing surface 15, and a cap 17 carried by the upper surface of the interconnect layer 11 and having an opening 28 aligned with the image sensing surface. The cap 17 illustratively includes an upper wall 22 spaced above the interconnect layer 11 and the IC to define an internal cavity 20. The cap 17 defines an air vent 21 coupled to the internal cavity 20.

In the illustrated embodiment, the cap 17 has an inner peripheral edge 18 spaced from adjacent portions of the transparent plate 16 to define the air vent 21. The inner peripheral edge 18 extends laterally over the adjacent portions of the transparent plate 16. In this embodiment, the air vent 21 may have a vertical gap of about 250-500 microns.

Moreover, the image sensing device 10 illustratively includes a plurality of bond wires 25a-25b extending between the image sensor IC 13 and the interconnect layer 11. The image sensing device 10 illustratively includes encapsulation material 26 covering a portion (distal portions) of the plurality of bond wires 25a-25b. The image sensing device 10 illustratively includes a first adhesive layer 24 between the cap 17 and the interconnect layer 11, and a second adhesive layer 25 between the transparent plate 16 and the image sensor IC 13.

Also, the image sensing device 10 illustratively includes a surface mounted component (SMC) 27 (e.g., capacitor, resistor) carried by the upper surface of the interconnect layer 11. The SMC 27 is at least partially surrounded by the encapsulation material 26, depending on placement. The image sensing device 10 may include electrically conductive traces (not shown) carried by the upper surface of the interconnect layer 11 and being coupled to the SMC 27, the plurality of bond wires 25a-25b, and the plurality of grid array contacts 12a-12h.

Referring now additionally to FIGS. 5A-5E, another aspect is directed to a method for making the image sensing device 10. The method may include coupling an image sensor IC 13 to an interconnect layer 11 and to a plurality of grid array contacts 12a-12h carried by the interconnect layer, the image sensor IC having an image sensing surface 15, and coupling a transparent plate 16 to the image sensor IC and aligned with the image sensing surface. The method may include coupling a cap 17 to the interconnect layer 11 and having an opening 28 aligned with the image sensing surface 15, the cap having an upper wall 22 spaced above the interconnect layer and the image sensor IC 13 to define an internal cavity 20, and the cap defining an air vent 21 coupled to the internal cavity.

Figure 5A:
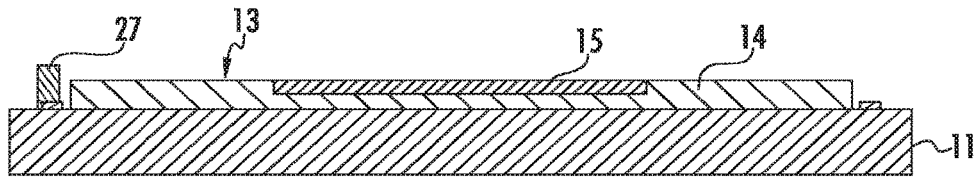
FIGS. 5A-5E are schematic cross-sectional views of steps in making the image sensing device of FIG. 3.
Figure 5B:
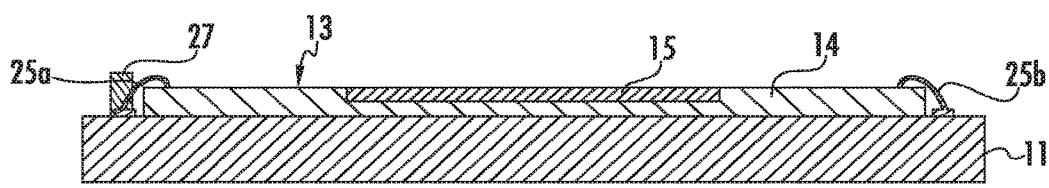
Figure 5C:
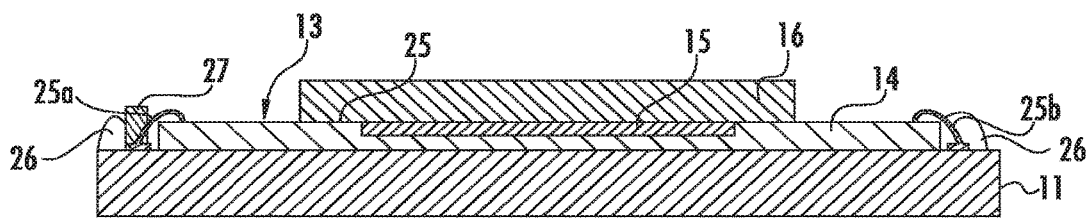
Figure 5D:
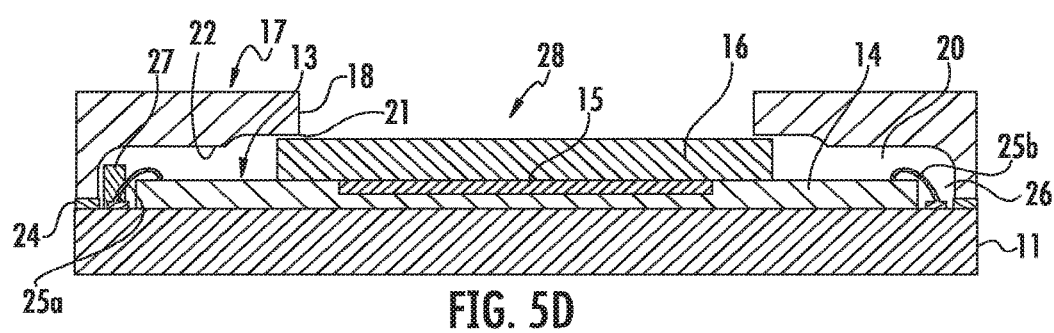
Figure 5E:
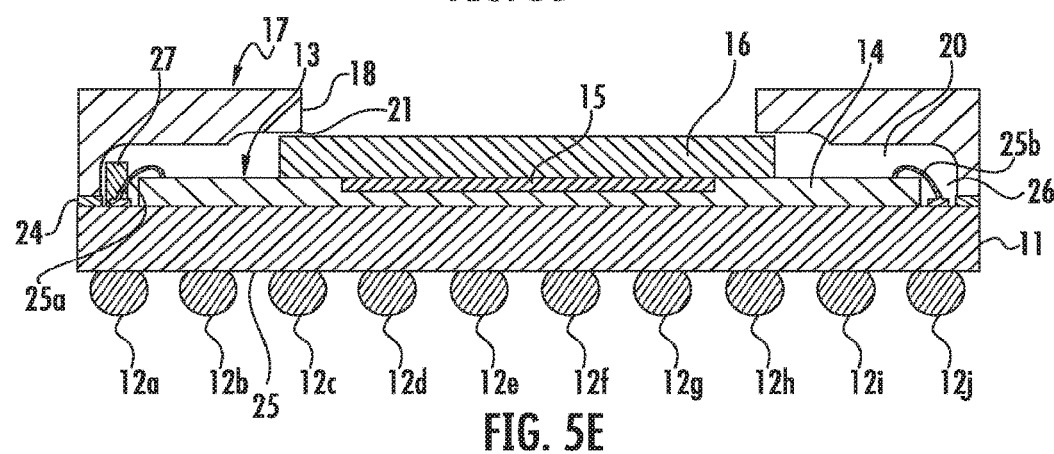

In the illustrated embodiment, the method illustratively includes an image sensor IC 13 attachment step (FIG. 5A), a wire bonding forming step (FIG. 5B), and a transparent plate 16 (e.g., glass plate) attachment step (FIG. 5C). The method further illustratively includes a cap 17 attachment step (FIG. 5D), and a BGA contact 12a-12j attachment step (FIG. 5E).

As perhaps best seen in FIG. 3, the upper wall 22 of the cap 17 includes a multi-step shoulder. The multi-step shoulder may prevent flexing of the cap 17 during the cap attach step (FIG. 5D). The multi-step shoulder illustratively includes a first portion 19a adjacent an outer peripheral edge, and a second portion 19b being thinner than the first portion and adjacent the image sensor IC 13.

Advantageously, the image sensing device 10 may provide an approach to address potential issues with the prior art image sensing devices 100, 200. The construction of an organic substrate in the image sensing devices 100, 200 may require a balanced coefficient of thermal expansion (CTE) with the die thickness, plate thickness, adhesive material thickness and composition, substrate thickness, and mold compound and thickness to prevent cracks and de-lamination.

In short, since the image sensing devices 100, 200 can warp in high stress applications, such as automobile applications, the image sensing devices may fail during use. Of course, this may reduce the reliability of the prior art image sensing devices 100, 200.

Helpfully, the image sensing device 10 provides an open cavity approach to address the issues with the prior art image sensing devices 100, 200. In particular, the image sensing device 10 may limit the stress factor since CTE mismatch is reduced. In the image sensing device 10, the air vent 21 provides a coupling between the internal cavity 20 and the external environment, preventing additional CTE mismatch stress. The image sensing device 10 may be quite helpful in automobile applications, due to the temperature and humidity variations.

Referring now additionally to FIGS. 4 and 6A-6F, another embodiment of the image sensing device 10' is now described. In this embodiment of the image sensing device 10', those elements already discussed above with respect to FIGS. 2 and 5A-5E are given prime notation and most require no further discussion herein. This embodiment differs from the previous embodiment in that this image sensing device 10' has the air vent 21' extending through the upper wall 22' of the cap 17'. The transparent plate 16' is illustratively received within the opening 28' of the cap 17'. Also, the transparent plate 16' is thicker than in the above embodiment, and is also flush with the cap 17'. In other embodiments (not shown), the transparent plate 16' may be offset with the cap 17'.

The image sensing device 10' illustratively includes adhesive material 23' between the cap 17' and the transparent plate 16'. The air vent 21' may have a width of about 250 microns, and may have a cylindrical shape, for example.

Figure 6A:
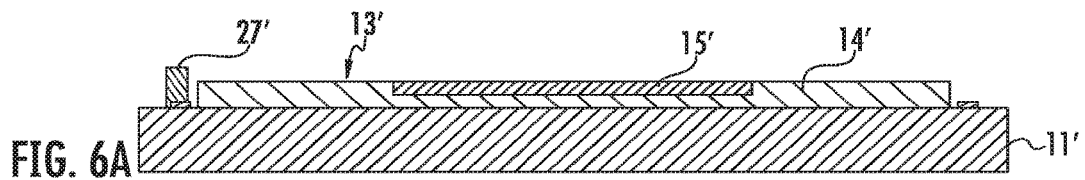
FIGS. 6A-6F are schematic cross-sectional views of steps in making the image sensing device of FIG. 4.
Figure 6B:
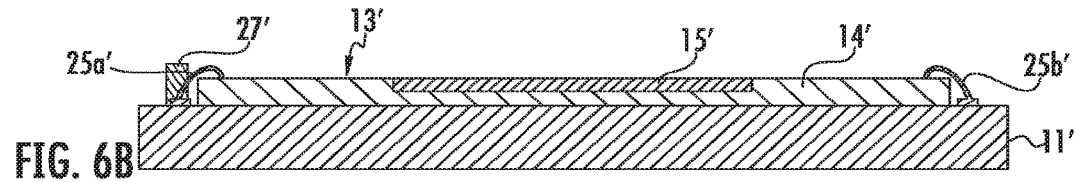
Figure 6C:
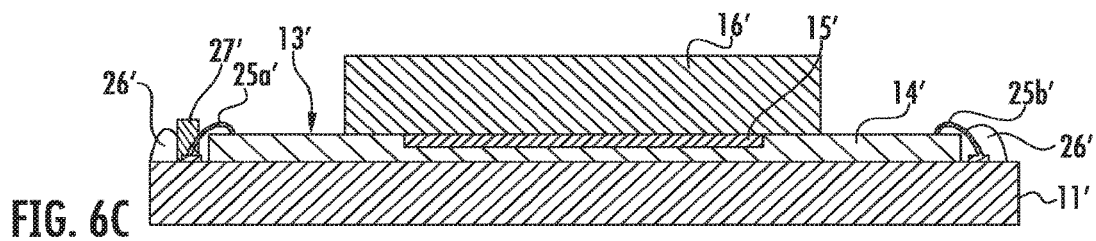

The method for making the image sensing device 10' illustratively includes an image sensor IC 13' die attach step (FIG. 6A), a wire bonding step (FIG. 6B), and a transparent plate 16' attach/adhesive seal step (FIG. 6C). The method further illustratively includes a cap 17' attach and adhesive seal step (FIGS. 6D and 6E), and a BGA contact attach step (FIG. 6F).

Figure 6D:
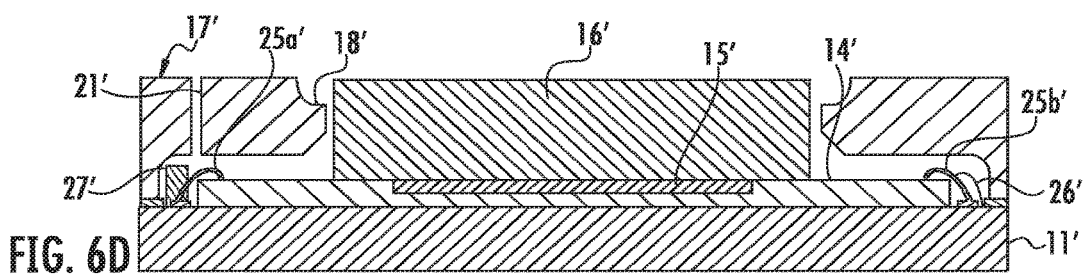
Figure 6E:
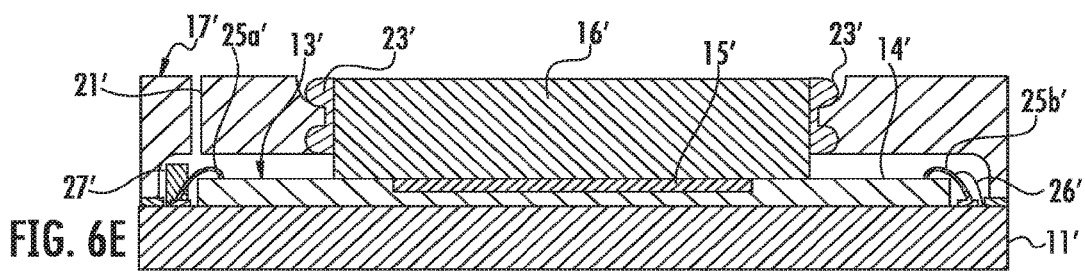
Figure 6F:
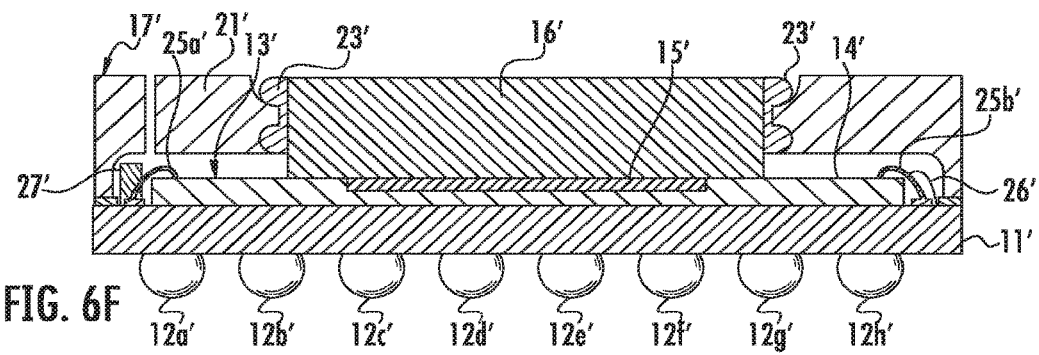

As perhaps best seen in FIG. 6D, the inner peripheral edge 18' of the cap 17' includes a multi-surface shoulder. The multi-surface shoulder may prevent flexing of the cap 17' during the cap attach step (FIG. 6E). The multi-surface shoulder illustratively includes a curved recess, a flat surface adjacent the curved recess, and a flat inclined surface adjacent the flat surface and the image sensor IC 13'.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

What is claimed is:

1. An image sensing device comprising:
   an interconnect layer;
   a plurality of grid array contacts arranged on a bottom side of the interconnect layer;
   an image sensor integrated circuit (IC) carried by the interconnect layer, the image sensor IC having an image sensing surface;
   a plurality of electrical connections coupled between the image sensor IC and an upper side of the interconnect layer, the upper side opposite the bottom side;
   a transparent plate overlying the image sensing surface of the image sensor IC; and
   a cap carried by the interconnect layer and having an opening overlying the transparent plate and the image sensing surface, wherein the cap has an upper wall spaced above the interconnect layer and the image sensor IC to define an internal cavity and wherein the cap defines an air vent coupled between the internal cavity and an external atmospheric environment so that the internal cavity is freely and fluidly coupled to the external atmospheric environment.

2. The image sensing device of claim 1, wherein the cap has an inner peripheral edge spaced from adjacent portions of the transparent plate to define the air vent.

3. The image sensing device of claim 2, wherein the inner peripheral edge extends laterally over the adjacent portions of the transparent plate.

4. The image sensing device of claim 2, wherein the upper wall of the cap includes a multi-step shoulder.

5. The image sensing device of claim 1, wherein the air vent extends through the upper wall of the cap.

6. The image sensing device of claim 5, wherein the air vent extends vertically through the upper wall of the cap.

7. The image sensing device of claim 5, wherein the transparent plate is received within the opening of the cap.

8. The image sensing device of claim 7, further comprising adhesive material between the cap and the transparent plate.

9. The image sensing device of claim 1, wherein a top surface of the transparent plate is flush with an upper surface of the cap.

10. The image sensing device of claim 1, wherein the plurality of electrical connections comprises a plurality of bond wires extending between the image sensor IC and the interconnect layer.

11. The image sensing device of claim 10, further comprising encapsulation material covering a portion of the plurality of bond wires.

12. The image sensing device of claim 1, further comprising a first adhesive layer between the cap and the interconnect layer, and a second adhesive layer between the transparent plate and the image sensor IC.

13. The image sensing device of claim 1, wherein the air vent has a vertical gap of 250-500 microns.

14. The image sensing device of claim 1, further comprising a surface mounted component overlying the interconnect layer and laterally spaced from the image sensor IC.

15. The image sensing device of claim 14, wherein the surface mounted component comprises a resistor or a capacitor.

16. An image sensing device comprising:
    an interconnect layer and a plurality of ball grid array (BGA) contacts carried thereby;
    an image sensor integrated circuit (IC) carried by the interconnect layer and coupled to the plurality of BGA contacts by vias extending through the interconnect layer, the image sensor IC having an image sensing surface;
    a transparent plate carried by the image sensor IC and overlying the image sensing surface; and
    a cap carried by the interconnect layer and having an opening overlying the image sensing surface, wherein the cap has an upper wall spaced above the interconnect layer and the image sensor IC to define an internal cavity and wherein the cap defines an air vent that extends through the upper wall of the cap and is coupled to the internal cavity.

17. The image sensing device of claim 16, further comprising:
    a plurality of bond wires extending between the image sensor IC and the interconnect layer; and
    encapsulation material covering a portion of the plurality of bond wires.

18. The image sensing device of claim 16, wherein the transparent plate is received within the opening of the cap.

19. The image sensing device of claim 18, further comprising adhesive material between the cap and the transparent plate.

20. A method of making an image sensing device, the method comprising:
    attaching an image sensor integrated circuit (IC) to an upper surface of an interconnect layer, a plurality of grid array contacts being carried on a lower surface of the interconnect layer, wherein the upper surface is opposite the lower surface;
    electrically connecting the image sensor IC to the interconnect layer;
    coupling a transparent plate to the image sensor IC so that the transparent plate overlies an image sensing surface of the image sensor IC; and
    coupling a cap to the interconnect layer so as to form an internal cavity between the image sensor IC and an upper wall of the cap, the upper wall having an opening exposing the transparent plate, wherein the cap defines an air vent coupled between the internal cavity and an external atmospheric environment so that the internal cavity is freely and fluidly coupled to the external atmospheric environment.

21. The method of claim 20, wherein coupling the cap to the interconnect layer comprises coupling the cap so that an inner peripheral edge of the cap is spaced from adjacent portions of the transparent plate to define the air vent.

22. The method of claim 20, wherein the air vent extends vertically through the upper wall of the cap.

23. The method of claim 20, wherein electrically connecting the image sensor IC to the interconnect layer comprises a wire bonding operation.

24. The method of claim 20, further comprising attaching the grid array contacts to the interconnect layer.

25. An image sensing device comprising:
    an interconnect layer and a plurality of ball grid array (BGA) contacts carried thereby;
    an image sensor integrated circuit (IC) carried by the interconnect layer and coupled to the plurality of BGA contacts, the image sensor IC having an image sensing surface;
    a plurality of bond wires extending between the image sensor IC and the interconnect layer;
    encapsulation material covering a portion of the plurality of bond wires;
    a transparent plate carried by the image sensor IC and overlying the image sensing surface; and a cap carried by the interconnect layer and having an opening overlying the image sensing surface, wherein the cap has an upper wall spaced above the interconnect layer and the image sensor IC to define an internal cavity and wherein the cap defines an air vent that extends through the upper wall of the cap and is coupled to the internal cavity.

26. The image sensing device of claim 25, wherein the transparent plate is received within the opening of the cap.

27. The image sensing device of claim 25, further comprising adhesive material between the cap and the transparent plate.

* * * * *